(12) United States Patent
Kohl et al.

(10) Patent No.: US 7,123,427 B2
(45) Date of Patent: Oct. 17, 2006

(54) OBJECTIVE, PARTICULARLY A PROJECTION OBJECTIVE FOR USE IN SEMICONDUCTOR LITHOGRAPHY

(75) Inventors: Alexander Kohl, Aalen (DE); Hubert Holderer, Koenigsbronn (DE); Werner Lang, Geislingen (DE); Hartmut Brandenburg, Westhausen (DE)

(73) Assignee: Carl Zeiss SMT AG, Oberkochen (DE)

( * ) Notice: Subject to any disclaimer, the term of this patent is extended or adjusted under 35 U.S.C. 154(b) by 80 days.

(21) Appl. No.: 10/484,866

(22) PCT Filed: Jul. 20, 2002

(86) PCT No.: PCT/EP02/08110

§ 371 (c)(1),
(2), (4) Date: Jan. 23, 2004

(87) PCT Pub. No.: WO03/012529

PCT Pub. Date: Feb. 13, 2003

(65) Prior Publication Data

US 2004/0201909 A1    Oct. 14, 2004

(30) Foreign Application Priority Data

Jul. 26, 2001 (DE) ................. 101 36 387

(51) Int. Cl.
*G02B 7/02* (2006.01)
*G02B 7/182* (2006.01)

(52) U.S. Cl. .................. 359/819; 359/872
(58) Field of Classification Search ........ 359/819, 359/821, 872; 356/121, 124, 399, 500, 614; 355/53
See application file for complete search history.

(56) References Cited

U.S. PATENT DOCUMENTS

| | | |
|---|---|---|
| 3,077,958 A | 2/1963 | Grimsey |
| 3,802,781 A | 4/1974 | Wright |
| 3,837,125 A | 9/1974 | Johnson |
| 3,879,105 A | 4/1975 | Broche et al. |
| 3,917,385 A | 11/1975 | Caswell |
| 4,038,971 A | 8/1977 | Bezborodko |
| 4,060,315 A | 11/1977 | Heinz |
| 4,092,518 A | 5/1978 | Merard |
| 4,162,120 A | 7/1979 | Moreno |
| 4,195,913 A | 4/1980 | Dourte et al. |
| 4,202,605 A | 5/1980 | Heinz |
| 4,226,507 A | 10/1980 | Fuschetto |

(Continued)

FOREIGN PATENT DOCUMENTS

DE        100 15 953        10/2000

(Continued)

OTHER PUBLICATIONS

Ellis, "Low-cost Bimorph Mirrors in Adaptice Optics," Imperial College of science, Technology & Medicine, University of London, 1999.

(Continued)

*Primary Examiner*—Drew A. Dunn
*Assistant Examiner*—Aline D. McNaull
(74) *Attorney, Agent, or Firm*—Wells St. John, P.S.

(57) ABSTRACT

The invention relates to an objective, particularly a projection objective for use in semiconductor lithography, comprising optical elements such as lenses (16) and mirrors (11a). According to the invention, at least a portion of the optical elements (16, 11a) is provided with a reflective surface outside of the optically active area serving as the reference surface (12) for a the optical element inside the objective (8).

13 Claims, 1 Drawing Sheet

U.S. PATENT DOCUMENTS

| | | | |
|---|---|---|---|
| 4,236,296 A | 12/1980 | Woolhouse et al. | |
| 4,268,122 A * | 5/1981 | Deshaw | 248/549 |
| 4,277,141 A | 7/1981 | Kleiber | |
| 4,295,710 A | 10/1981 | Heinz | |
| 4,348,090 A | 9/1982 | Iizuka | |
| 4,380,391 A | 4/1983 | Buser et al. | |
| 4,389,115 A | 6/1983 | Richter | |
| 4,403,421 A | 9/1983 | Shepherd | |
| 4,408,874 A | 10/1983 | Zinky et al. | |
| 4,537,473 A * | 8/1985 | Maschmeyer | 356/513 |
| 4,659,225 A | 4/1987 | Takahashi | |
| 4,672,439 A | 6/1987 | Florence et al. | |
| 4,674,874 A | 6/1987 | Halldorsson et al. | |
| 4,705,369 A | 11/1987 | Humpal | |
| 4,710,276 A | 12/1987 | Kull | |
| 4,722,592 A | 2/1988 | Stolfi | |
| 4,740,276 A | 4/1988 | Marmo et al. | |
| 4,826,304 A | 5/1989 | Guch et al. | |
| 4,849,668 A | 7/1989 | Crawley et al. | |
| 4,865,454 A | 9/1989 | Lazzarini et al. | |
| 4,871,237 A | 10/1989 | Anzai et al. | |
| 4,932,770 A | 6/1990 | Caravaty | |
| 4,932,778 A | 6/1990 | Parra | |
| 4,953,965 A | 9/1990 | Iwase et al. | |
| 4,959,531 A | 9/1990 | Marino | |
| 4,967,088 A | 10/1990 | Stengl et al. | |
| 4,969,726 A | 11/1990 | Koning | |
| 5,025,284 A | 6/1991 | Komoriya et al. | |
| 5,026,977 A | 6/1991 | Hubbard, Jr. | |
| 5,074,654 A | 12/1991 | Alden et al. | |
| 5,079,414 A | 1/1992 | Martin | |
| 5,132,979 A | 7/1992 | Erbert | |
| 5,157,555 A | 10/1992 | Reno | |
| 5,204,712 A | 4/1993 | Bouwer et al. | |
| 5,210,650 A | 5/1993 | O'Brien et al. | |
| 5,339,720 A | 8/1994 | Pellarin et al. | |
| 5,400,184 A | 3/1995 | Kuklo | |
| 5,414,557 A | 5/1995 | Phillips | |
| 5,428,482 A | 6/1995 | Bruning et al. | |
| 5,438,451 A | 8/1995 | Schweizer | |
| 5,485,053 A | 1/1996 | Baz | |
| 5,529,277 A | 6/1996 | Ostaszewski | |
| 5,537,262 A | 7/1996 | Aoki et al. | |
| 5,642,237 A | 6/1997 | Miyawaki et al. | |
| 5,694,257 A | 12/1997 | Arnone et al. | |
| 5,719,846 A | 2/1998 | Matoba et al. | |
| 5,724,017 A | 3/1998 | Pla et al. | |
| 5,784,355 A | 7/1998 | Abe | |
| 5,835,284 A * | 11/1998 | Takahashi et al. | 359/726 |
| 5,870,133 A | 2/1999 | Naiki | |
| 5,891,317 A | 4/1999 | Teichmann et al. | |
| 5,894,370 A * | 4/1999 | Okuda et al. | 359/822 |
| 5,973,863 A * | 10/1999 | Hatasawa et al. | 359/823 |
| 5,986,795 A | 11/1999 | Chapman et al. | |
| 5,986,827 A | 11/1999 | Hale | |
| 6,054,784 A | 4/2000 | Sperling et al. | |
| 6,108,121 A | 8/2000 | Mansell et al. | |
| 6,144,511 A | 11/2000 | Umetsu et al. | |
| 6,160,628 A | 12/2000 | Inoue | |
| 6,166,868 A | 12/2000 | Holderer et al. | |
| 6,208,407 B1 | 3/2001 | Loopstra | |
| 6,229,657 B1 | 5/2001 | Holderer et al. | |
| 6,246,822 B1 | 6/2001 | Kim et al. | |
| 6,252,334 B1 | 6/2001 | Nye et al. | |
| 6,252,648 B1 | 6/2001 | Hase et al. | |
| 6,252,712 B1 | 6/2001 | Furter et al. | |
| 6,259,571 B1 | 7/2001 | Holderer et al. | |
| 6,275,344 B1 | 8/2001 | Holderer | |
| 6,290,363 B1 | 9/2001 | Masutani | |
| 6,296,811 B1 | 10/2001 | Sasaki | |
| 6,307,688 B1 | 10/2001 | Merz et al. | |
| 6,337,484 B1 | 1/2002 | Loopstra et al. | |
| 6,341,006 B1 | 1/2002 | Murayama et al. | |
| 6,369,959 B1 | 4/2002 | Trunz et al. | |
| 6,373,552 B1 | 4/2002 | Braat et al. | |
| 6,392,825 B1 | 5/2002 | Trunz et al. | |
| 6,405,533 B1 | 6/2002 | Rastegar et al. | |
| 6,411,368 B1 | 6/2002 | Matsumoto et al. | |
| 6,411,426 B1 | 6/2002 | Meehan et al. | |
| 6,428,173 B1 | 8/2002 | Dhuler et al. | |
| 6,445,516 B1 | 9/2002 | Osterried | |
| 6,473,247 B1 | 10/2002 | Keller et al. | |
| 6,478,434 B1 | 11/2002 | Streetman et al. | |
| 6,496,466 B1 | 12/2002 | Lee et al. | |
| 6,501,605 B1 | 12/2002 | Moriya | |
| 6,503,383 B1 | 1/2003 | Holderer et al. | |
| 6,509,670 B1 | 1/2003 | Jeong et al. | |
| 6,521,892 B1 | 2/2003 | Emanuel et al. | |
| 6,537,479 B1 | 3/2003 | Colea | |
| 6,552,862 B1 | 4/2003 | Dieker | |
| 6,566,627 B1 | 5/2003 | Brandinger et al. | |
| 6,580,570 B1 | 6/2003 | Becker et al. | |
| 6,585,379 B1 | 7/2003 | Yokoyama et al. | |
| 6,594,057 B1 | 7/2003 | Drake et al. | |
| 6,594,204 B1 * | 7/2003 | Yamamoto et al. | 369/44.14 |
| 6,603,615 B1 | 8/2003 | Melzer et al. | |
| 6,614,504 B1 | 9/2003 | Aoki | |
| 6,628,371 B1 | 9/2003 | Ishikawa | |
| 6,633,107 B1 | 10/2003 | Calabro et al. | |
| 6,646,713 B1 | 11/2003 | Ishii | |
| 6,653,887 B1 | 11/2003 | Haeusser-Boehm et al. | |
| 6,727,984 B1 | 4/2004 | Becht | |
| 6,729,062 B1 | 5/2004 | Thomas et al. | |
| 2002/0021903 A1 | 2/2002 | Ito et al. | |
| 2002/0163741 A1 | 11/2002 | Shibazaki | |
| 2002/0176094 A1 | 11/2002 | Petasch et al. | |

FOREIGN PATENT DOCUMENTS

| | | | |
|---|---|---|---|
| EP | 1 001 301 A2 * | 5/2000 | |
| JP | 10-282392 A * | 10/1998 | |
| JP | 410282392 A * | 10/1998 | |
| WO | WO86 05281 | 9/1986 | |
| WO | WO99 66542 | 12/1999 | |

OTHER PUBLICATIONS

Sato et al., Adaptive PVDF piezoelectric deformable mirror system, Applied Optics, vol. 19, No. 9, 1980, pp. 1430-1434.

Sato et al., "Multilayered deformable mirror using PVDF films," Applied Optics, vol. 21, No. 20, 1982, pp. 3664-3668.

Sato et al., "Transmission-type PVDF 2-D optical phase modulator," Applied Optics, vol. 20, No. 2, 1981, pp. 343-350.

Ro et al., "Vibration Control if Plates Using Self-Sensing Active Constrained Layer Damping," SPIE vol. 3672, 1999, pp. 200-209.

Krug et al., Application of a 6×8 Silicon APD Array and Hybrid Electronics for Scannerless 3D Imaging Ladar, NATO/IRIS Active Systems, 1995, vol. II, pp. 79-89.

Burns et al., "Compact, Multichannel receiver using InGaAs APDs for single pulse, eye,-safe, laser radar imagery," SPIE vol. 3065, 1997, pp. 22-29.

Schutz et al., "Calibration of an interferometer for testing cylindrical surfaces," 1995 Elsevier Science, pp. 512-520.

* cited by examiner

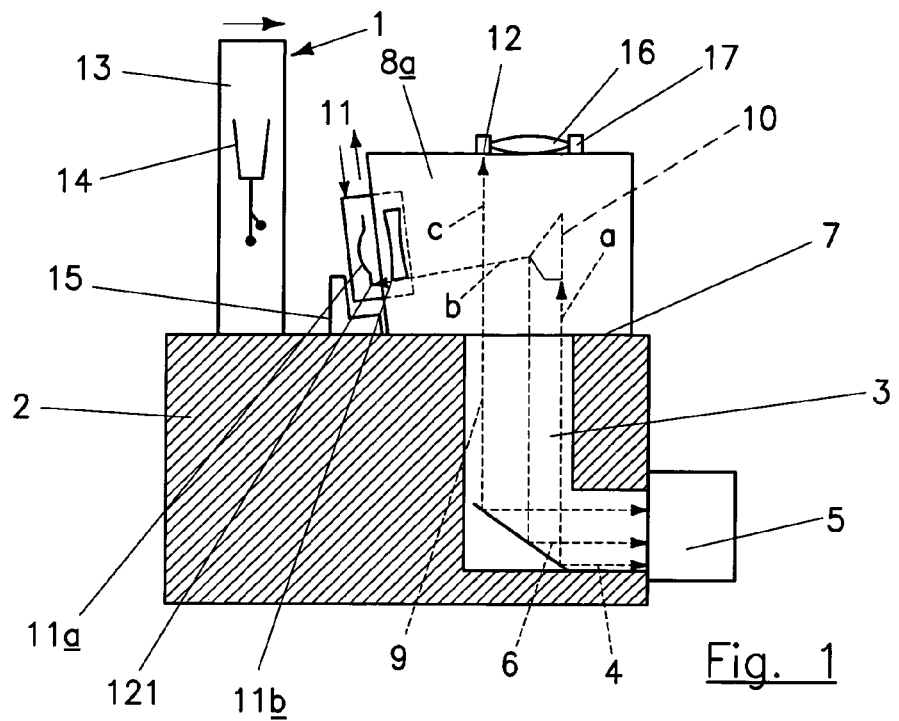
Fig. 1
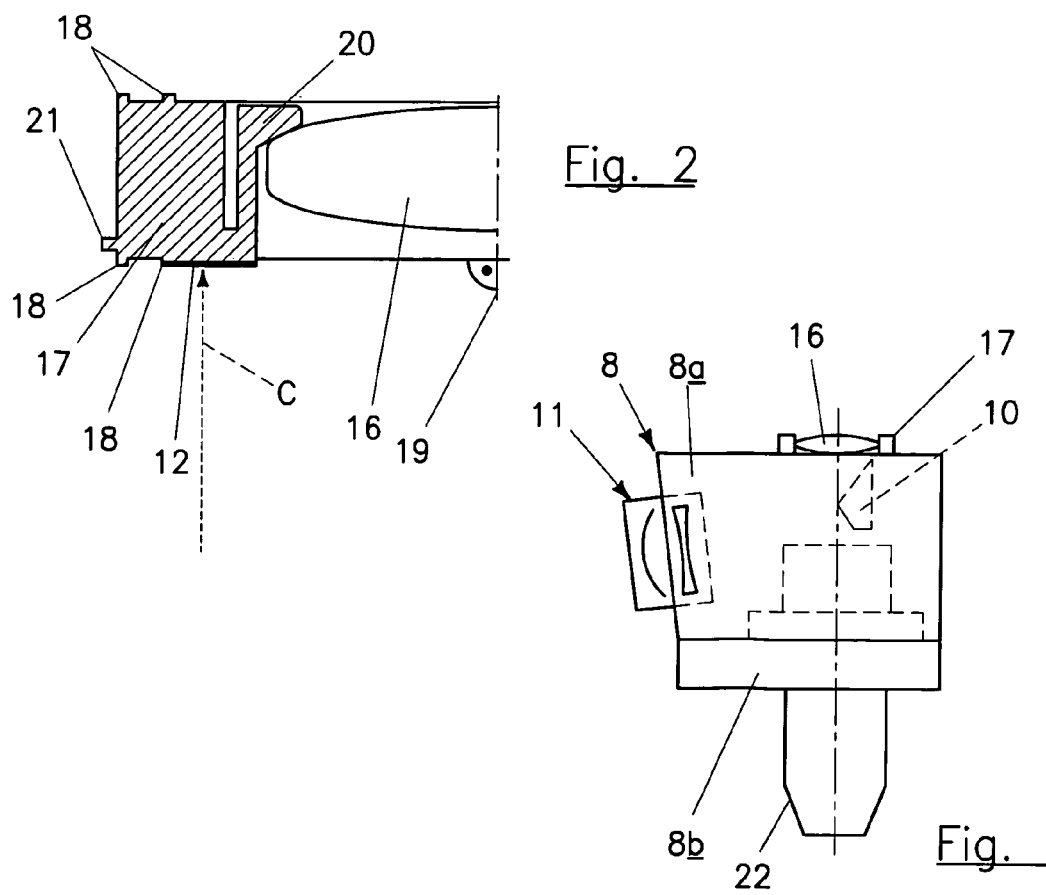
Fig. 2
Fig. 3

OBJECTIVE, PARTICULARLY A PROJECTION OBJECTIVE FOR USE IN SEMICONDUCTOR LITHOGRAPHY

CROSS REFERENCE TO RELATED APPLICATION

This application is a 35 U.S.C. §371 of and claims priority to PCT International Application Number PCT/WO2003/012529, which was filed 20 Jul. 2002, and was published in English which was based on German Patent Application No. 101 36 387.7 which was filed 26 Jul. 2001 and the teachings of which are incorporated herein by reference.

The invention relates to an objective, particularly a projection objective for use in semiconductor lithography, having optical elements such as lenses and mirrors.

When assembling an objective, particularly a projection objective in semiconductor lithography, for producing semiconductor elements, it is necessary for the individual objective parts such as, for example, lenses and mirrors, to be installed with very high absolute accuracy relative to one another as regards both the linear coordinates and the angular coordinates.

Optical elements used to date, for example mounts of lenses, have a centering collar on the outside diameter, and an upper and a lower surface with a reference and sealing collar as references for installation in the objective. A lens is aligned in this case such that its optical axis goes perpendicularly through the two reference surfaces of the mount. For this purpose, the lens is "rolled in" exactly with reference to its optical axis and then bonded to the mount. In this case, however, it is impossible to avoid an offset relative to the mechanical axis of the flange or of the mount. For this reason, the offset of the optical axis of the lens relative to the centering collar on the mount is measured for size and angular position, and then used to provide an appropriate lead during mounting into the objective. This is frequently sufficient, since each mount generally rests on the preceding one and then needs only to be centered laterally.

In the case of a catadioptric objective, however, it is necessary to measure the angular position of the individual lens groups relative to one another ever a relatively large distance between a central body and the mounts. Known measuring machines, for example portal or stand-mounted measuring machines having tactile measuring keys can be used for this purpose and are, if appropriate, further provided with an optical measuring system for absolute determination of location and angle. Plane mirrors are used in this case to measure the reference surfaces of the respective optical element.

It is provided to adjust a reference surface with the aid of a plane mirror in order to adjust lens groups of a catadioptric objective in a subassembly in which the optical axis runs at least approximately horizontally and with a vertical subassembly in which the optical axis runs in the vertical direction. The plane mirror must subsequently be exchanged for the respective lens group.

It is disadvantageous in this case that, owing to the exchange of the plane mirror or mirrors with the respective lens group, not only is a higher outlay on installation necessary, but, in addition, new sources of error can occur.

It is therefore the object of the present invention to avoid the abovenamed disadvantages for an objective, particularly to create an objective of the type mentioned at the beginning that simplifies the adjustment, the aim also being to reduce possible sources of error.

This object is achieved according to the invention by means of the features named in the characterizing part of claim 1.

It is possible by virtue of the reference surfaces according to the invention, which are arranged on the optical element itself or on the mount thereof, for a lens or mirror group to be directly adjusted, specifically without making a detour via plane mirrors and a subsequent exchange resulting therefrom, which can always lead to errors.

The reflecting surface, for example a mirror surface, integrated in or on the optical, elements can be produced simultaneously with the optical element or with the mount. According to the known gluing-in operation for a lens, given an appropriate arrangement, the reflecting surface can also lie parallel to reference collars of the mount and thus perpendicular to the optical axis.

The reflecting surface can therefore be used to undertake an exact adjustment of the respective objective part relative to one or more specific reference points in the objective. This can, for example, be performed by means of an optical measuring system with the aid of measuring beams produced by an interferometer or an autocollimation telescope. All that is required is to design the size of the reflecting surface in accordance with the desired accuracy of adjustment and the available accuracy of the measuring means.

It is also advantageous that the reference via the corresponding reference surfaces, for example mirror surfaces, is already present in the objective 8 for a later control of the angular position of the installed optical elements. A later control is thereby possible without a high outlay.

An exemplary embodiment of the invention is described below in principle with the aid of the drawing, in which:

FIG. 1 shows an illustration of the principle of a measuring machine for measuring and adjusting optical elements installed in a frame structure of an objective;

FIG. 2 shows a half-section through a lens having the reflecting surface according to the invention on the mount; and FIG. 3 shows an illustration of the principle of a catadioptric objective.

A measuring machine 1, for example a portal measuring machine, of known design has a measuring table 2 as a granite block that has a vertical measuring bore 3 with a transverse bore 4 in the lower region. An autocollimation telescope 5 is flanged on at the end of the transverse bore 4. Of course, an interferometer can also be used instead of an autocollimation telescope 5. A deflecting mirror 6 is arranged at the point where the measuring bore 3 meets the transverse bore 4. The autocollimation telescope 5 can be calibrated at the start to the surface of the measuring table 2 as reference surface 7 with the aid of the deflecting mirror 6 and a plane mirror (not illustrated) that is laid on the surface of the measuring table 2 over the measuring bore 3. It is possible in this way for surfaces that are to be measured with the aid of the autocollimation telescope 5 always to be referenced in absolute terms relative to the measuring surface 7. The aim is to use the measuring machine 1 to measure the upper part of an objective 8, the optical elements being inserted into an upper frame structure 8a and a lower frame structure 8b.

The upper component of the objective is mounted with the upper frame structure 8a on the measuring table with its reference surface 7 in a first step, in order to assemble the objective 8 and/or to install the optical parts of the objective. The underside of the frame structure 8b likewise serves as reference surface 9.

A prismatic body 10 is inserted into the upper frame structure 8a. An optical subassembly 11 having a curved mirror 11a and one or more Senses 11b is simultaneously flanged on at the side. Subsequently, the underside of the prismatic body 10 is aligned as auxiliary surface by means of the autocollimation telescope 5 (see the beam path a in FIG. 1 in this regard). The auxiliary surface is produced during optical fabrication with an appropriate average accuracy relative to the front surfaces of the prismatic body 10. The prismatic body 10 is aligned in this way with an appropriate accuracy within the horizontal plane.

Subsequently, the lens group 11 with the curved mirror 11a is aligned relative to the autocollimation telescope 5 (see beam path b in FIG. 1). For this purpose the optical beam emanating from the autocollimation telescope 5 must be retroreflected. This is done by widening the diameter of the curved mirror 11a, which is located outside the optically active region, the point being that a reflected surface is formed on the widening of the diameter in the form of a mirror surface as reference surface 121. In other words: the reflecting surface is located in a region outside the region required for imaging. It is therefore necessary merely to select the beam path b such that it strikes the annular mirror surface 121. In this way, the entire optical subassembly 11 with its optically active surfaces can then be aligned with appropriate accuracy with reference to its angular position.

The required adjustment and/or the measurement of the distance of the optical subassembly 11 from the tip of the prismatic body 10 can be performed by a measuring head 13, which can be moved appropriately on the measuring table 3 in the direction of the arrow, of the measuring machine 1, and by known measurements with the aid of one or more tactile measuring elements 14.

A separate, exactly controlled lifting table 15 that grips the underside of the optical subassembly 11 and raises or lowers the latter as appropriate can be used for exactly displacing the optical subassembly 11 on the outer surface or an interface surface of the upper frame structure 8a in accordance with the direction of action illustrated by an arrow.

Subsequently, a lens or lens group 16 is mounted on the upper frame structure 8a. the lens 16 or, in the case of a lens group, the lens 16 situated next to the measuring table 2, is likewise provided, in the region of its mount 17, with a reference surface in the form of a mirror surface 12 as reflecting surface. The lens 16 is then aligned exactly by means of the mirror surface 12. All that is required for this purpose is to direct the measuring beam c appropriately onto the mirror surface 12.

As may be seen, it is possible in this way to measure and install the individual optical elements or the components of the objective 8 with high accuracy in an absolute fashion in terms both of location and of angle. This purpose is also served in a known way by sealing and reference collars 18 on the undersides and on the top sides of the mount 17 of lenses 16. The same also holds, of course, for the curved mirror 11a of the subassembly 11. The reference collars 18, which have a vary high plainness surface, are situated exactly perpendicular to the optical axis 19. It is to be ensured, concerning the connection of the lens 16 to the mount 17, that bonding into and onto bearing surfaces 20 of the mount 17 is performed such that the optical axis 19 is situated perpendicular to the reference surfaces 18. Since the mirror surface 12 has been applied to one of the reference collars 18, for which purpose the corresponding reference collar 18 is widened to such an extent as to produce a sufficiently large annular surface for reflection of the measuring beams b and c, the mirror surface 12 is thus likewise situated perpendicular to the optical axis 19. In general, a width of approximately 5 mm will be sufficient for the mirror surface 12 (see enlarged illustration in FIG. 2). In order to displace the lens 16 laterally for the desired adjustment, it has, on the outer circumference, a centering collar 21 on which actuators (not illustrated) can act for displacement purposes.

The refractive part 22 installed in the lower frame structure 8b can be measured and adjusted in a similar way. The assembly of the two frame structures 8a and 8b can be performed subsequently in any desired way.

Although the use of the mirror surfaces 121 and 12 for a curved mirror 11a and the mount 17 of a lens 16 is described only for a measurement method with the aid of the measuring machine 1, it is, of course, clear that optical elements provided with the reflecting surface according to the invention, for example the mirror surfaces 121 and 12, can also be used in another way within the scope of the invention for exactly adjusting and/or determining the location and angle of the respective optical element.

The mirror surfaces 121 and 12 can be taken into account appropriately, for example, in the fabrication as early as when producing the mount 17 and the lens 16 or the curved mirror 11a. Thus, the mirror surfaces 121 and 12 can be applied, for example, by electroplating a coating of nickel or chromium, for example, as an effectively reflection layer (the coating of the mirror surface 12 is illustrated greatly enlarged in FIG. 2 for reasons of clarity). Before applying the coating, the corresponding surface or a corresponding region of the mount 17 will be finely treated mechanically, for example by lapping.

After application of the coating, the surface is polished for good reflection. As a last step, lens seat, lower reference surface 18 and centering collar 21 are finally turned. The mirror surface 12 is thereby automatically aligned relative to the lens support during this cycle.

The invention claimed is:

1. A projection objective for use in semiconductor lithography for the purpose of producing semiconductor elements having optical elements such as lenses and mirrors, characterized in that at least some of the optical elements are provided in each case with a reflecting surface outside an optically active region, as a reference surface for adjusting the at least some of the optical element inside the objective or inside a subassembly of the objective relative to other optical elements in the objective, and further comprising a mount directly contacting and supporting at least one of the optical elements, wherein at least one of the reflecting surfaces is supported on the mount.

2. An objective having optical elements such as lenses and mirrors that are supported in mounts, characterized in that at least some of the mounts of the optical elements are provided in each case with a reflecting surface for adjusting the optical element inside the objective or inside a subassembly of the objective wherein given a lens as one of the optical elements, the reflecting surface is aligned parallel to one or more reference collars of the mount and the reflecting surface is formed by lapping and polishing a part of the mount.

3. The objective as claimed in claim 1 or 2, characterized in that the reference surface is perpendicular to the optical axis.

4. The objective as claimed in claim 1 or 2, characterized in that the reference surface is designed as a mirror surface.

5. An objective having optical elements such as lenses and mirrors that are supported in mounts, characterized in that at least some of the mounts of the optical elements are provided in each case with a reflecting surface for adjusting the optical element inside the objective or inside a subassembly of the objective wherein given a lens as one of the optical elements, the reflecting surface is aligned parallel to one or more reference collars of the mount and the reflecting surface is formed by coating at least a part of the mount.

6. The objective as claimed in claim 5, characterized in that the coating has nickel or chromium.

7. The objective as claimed in claim 1, characterized in that the objective is a catadioptric projection objective.

8. The objective as claimed in claim 1, showing lens groups in a subassembly in which the optical axis runs at least approximately horizontally and with a vertical subassembly in which the optical axis runs in the vertical direction.

9. The objective as claimed in claim 1 wherein the mount comprises a single and integral structure.

10. The objective as claimed in claim 1 wherein the mount comprises a discrete structure.

11. The objective as claimed in claim 2, wherein the at least some of the mounts comprise individually separate and distinct structures.

12. The objective as claimed in claim 2, wherein the objective comprises a catadioptric projection objective.

13. The objective as claimed in claim 5, wherein the at least some of the mounts comprise individually separate and distinct structures.

* * * * *

UNITED STATES PATENT AND TRADEMARK OFFICE
CERTIFICATE OF CORRECTION

PATENT NO. : 7,123,427 B2  Page 1 of 1
APPLICATION NO. : 10/484866
DATED : October 17, 2006
INVENTOR(S) : Hubert Holderer et al.

It is certified that error appears in the above-identified patent and that said Letters Patent is hereby corrected as shown below:

On the title page; item: (57) Abstract, line 7 –
   Replace "reference surface (12) for a the optical element inside the"
   With --reference surface (12) for adjusting the optical element inside the--

Col. 3, line 3 –
   Replace "mirror 11$a$ and one or more Senses 11$b$ is simultaneously"
   With --mirror 11$a$ and one or more lenses 11$b$ is simultaneously--

Col. 3, line 42 –
   Replace "upper frame structure 8$a$. the lens 16 or, in the case of a lens"
   With --upper frame structure 8$a$. The lens 16 or, in the case of a lens--

Col. 3, line 58 –
   Replace "which have a vary high plainness surface, are situated"
   With --which have a very high plainness surface, are situated--

Signed and Sealed this

Twenty-fourth Day of April, 2007

JON W. DUDAS
*Director of the United States Patent and Trademark Office*

UNITED STATES PATENT AND TRADEMARK OFFICE
CERTIFICATE OF CORRECTION

PATENT NO.        : 7,123,427 B2
APPLICATION NO.   : 10/484866
DATED             : October 17, 2006
INVENTOR(S)       : Hubert Holderer et al.

It is certified that error appears in the above-identified patent and that said Letters Patent is hereby corrected as shown below:

Face page, (57) Abstract, line 7 –
  Replace "reference surface (12) for a the optical element inside the"
  With --reference surface (12) for adjusting the optical element inside the--

Col. 3, line 3 –
  Replace "mirror 11*a* and one or more Senses 11*b* is simultaneously"
  With --mirror 11*a* and one or more lenses 11*b* is simultaneously--

Col. 3, line 42 –
  Replace "upper frame structure 8*a*. the lens 16 or, in the case of a lens"
  With --upper frame structure 8*a*. The lens 16 or, in the case of a lens--

Col. 3, line 58 –
  Replace "which have a vary high plainness surface, are situated"
  With --which have a very high plainness surface, are situated--

Signed and Sealed this

First Day of May, 2007

JON W. DUDAS
*Director of the United States Patent and Trademark Office*